United States Patent
Hshieh et al.

(10) Patent No.: US 6,472,678 B1
(45) Date of Patent: Oct. 29, 2002

(54) TRENCH MOSFET WITH DOUBLE-DIFFUSED BODY PROFILE

(75) Inventors: Fwu-Iuan Hshieh, Saratoga, CA (US); Koon Chong So, Fremont, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 09/595,486

(22) Filed: Jun. 16, 2000

(51) Int. Cl.$^7$ ............................................... H01L 29/76
(52) U.S. Cl. ........................... 257/3; 257/328; 257/329; 257/331
(58) Field of Search ................................. 257/328–342, 257/401; 438/268–274

(56) References Cited

U.S. PATENT DOCUMENTS

| | | | |
|---|---|---|---|
| 5,072,266 A | 12/1991 | Bulucea et al. | 357/23.4 |
| 5,814,858 A | * 9/1998 | Williams | 257/328 |
| 5,821,583 A | * 10/1998 | Hshieh et al. | 257/330 |
| 5,877,538 A | 3/1999 | Williams | 257/401 |
| 6,031,265 A | 2/2000 | Hshieh | 257/334 |
| 6,069,043 A | 5/2000 | Floyd et al. | 438/270 |
| 6,084,264 A | * 7/2000 | Darwish | 257/329 |
| 6,215,168 B1 | * 4/2001 | Brush et al. | 257/494 |
| 6,348,712 B1 | * 2/2002 | Korec et al. | 257/330 |

FOREIGN PATENT DOCUMENTS

| EP | 0923137 A2 | 6/1999 | H01L/29/78 |
|---|---|---|---|
| JP | 59-74674 A | 4/1984 | H01L/29/78 |
| JP | 63-186476 | * 8/1988 | |

* cited by examiner

*Primary Examiner*—Steven Loke
*Assistant Examiner*—Ori Nadav
(74) *Attorney, Agent, or Firm*—Mayer Fortkort & Williams, PC; David B. Bonham, Esq.; Karin L. Williams, Esq.

(57) ABSTRACT

A trench MOSFET device and process for making the same are described. The trench MOSFET has a substrate of a first conductivity type, an epitaxial layer of the first conductivity type over the substrate, the epitaxial layer having a lower majority carrier concentration than the substrate, a plurality of trenches within the epitaxial layer, a first insulating layer, such as an oxide layer, lining the trenches, a conductive region, such as a polycrystalline silicon region, within the trenches adjacent to the first insulating layer, and one or more trench body regions and one or more termination body regions provided within an upper portion of the epitaxial layer, the termination body regions extending into the epitaxial layer to a greater depth than the trench body regions. Each trench body region and each termination body region has a first region of a second conductivity type, the second conductivity type being opposite the first conductivity type, and a second region of the second conductivity type adjacent the first region, the second region having a greater majority carrier concentration than the first region, and the second region being disposed above the first region and adjacent and extending to an outer wall of each of the plurality of trenches. A plurality of source regions of the first conductivity type are positioned adjacent the trenches within upper portions the trench body regions.

13 Claims, 4 Drawing Sheets

TRENCH MOSFET WITH DOUBLE-DIFFUSED BODY PROFILE

FIELD OF THE INVENTION

The present invention relates generally to microelectronic circuits, and more particularly to trench MOSFET devices.

BACKGROUND OF THE INVENTION

A DMOS (Double diffused MOS) transistor is a type of MOSFET (Metal Oxide Semiconductor Field Effect Transistor) that uses diffusion to form the transistor region. DMOS transistors are typically employed as power transistors for high voltage power integrated circuits. DMOS transistors provide high current per unit area where low forward voltage drops are required.

A typical discrete DMOS circuit includes two or more individual DMOS transistor cells which are fabricated in parallel. The individual DMOS transistor cells share a common drain contact, while their sources are all shorted together with metal and their gates are shorted together by polysilicon. Thus, even though the discrete DMOS circuit is constructed from a matrix of smaller transistors, it behaves as if it were a single large transistor.

One particular type of DMOS transistor is a so-called trench DMOS transistor in which the channel is formed vertically and the gate is formed in a trench extending between the source and drain. The trench, which is lined with a thin oxide layer and filled with polysilicon, allows less constricted current flow and thereby provides lower values of specific on-resistance. Examples of trench DMOS transistors are disclosed in U.S. Pat. Nos. 5,072,266, 5,541,425, and 5,866,931.

FIG. 1 illustrates half of a hexagonally shaped prior art trench DMOS structure 21. The structure includes an n+ substrate 23, upon which is grown a lightly doped epitaxial layer (n) 25 of a predetermined depth $d_{epi}$. Within the epi layer 25, a body region 27 of opposite conductivity (p, p+) is provided. Except in a central region, the p body region is substantially planar and lies a distance $d_{min}$ below the top surface of the epi layer. Another layer 28 (n+) overlying most of the body region 27 serves as source. A hexagonally shaped trench 29 is provided in the epitaxial layer, opening toward the top and having a predetermined depth $d_{tr}$. The trench 29 is associated with a transistor cell defines a cell region 31 that is also hexagonally shaped in horizontal cross-section. Within the cell region 31, the body region rises to the top surface of the epi layer and forms an exposed pattern 33 in a horizontal cross section at the top surface of the cell region. This central exposed portion of the body region is more heavily doped (p+) than the substantially planar remainder of the body region. Further, this central portion of the body region extends to a depth $d_{max}$ below the surface of the epi layer that is greater than the trench depth $d_{tr}$ for the transistor cell. A central portion 27c of the body region lies below a plane that is defined by the bottom of the trench 29 for the transistor cell. By creating such a deep p+ region, breakdown voltage is forced away from the trench surface and into the bulk of the semiconductor material.

Demand persists for trench DMOS devices having ever-lower on-resistance. The simplest way to reduce on-resistance is to increase cell density. Unfortunately, with a device such as that shown in FIG. 1, the cell density is limited by lateral diffusion of dopant in the p+ region. More specifically, as the dimensions of the trench mesa region are reduced to increase cell density, the p+ region eventually diffuses laterally into the channel region, significantly increasing the threshold voltage of the device.

It is also well known that the gate charges associated with trench DMOS devices increase when cell density is increased, for example, in connection with efforts to lower on-resistance. One way to combat such an increase in gate charge is to reduce the depth of the trenches and the corresponding P-body junction depth. By reducing trench depth (and the associated P-body junction depth), gate charge can be decreased. Unfortunately, when trench depth and P-body junction depth are decreased, device breakdown voltage degrades in the termination area due to the shallower P-body junction in this area.

Hence, efforts to provide low on-resistance in trench DMOS devices by increasing cell density are presently frustrated by detrimental changes that simultaneously occur, for example, in connection with device threshold voltage, gate charge, and/or termination-area device breakdown voltage.

SUMMARY OF THE INVENTION

The above and other obstacles in the prior art are addressed by the MOSFET devices of the present invention.

According to an embodiment of the invention, a trench MOSFET device is provided, which comprises:

(a) a substrate of a first conductivity type;

(b) an epitaxial layer of the first conductivity type over the substrate, the epitaxial layer having a lower majority carrier concentration than the substrate;

(c) a plurality of trenches within the epitaxial layer;

(d) a first insulating layer, such as an oxide layer, lining the trenches;

(e) a conductive region, such as a polycrystalline silicon region, within the trenches adjacent to the first insulating layer;

(f) one or more trench body regions and one or more termination body regions provided within an upper portion of the epitaxial layer, the termination body regions extending into the epitaxial layer to a greater depth than the trench body regions; each trench body region and each termination body region comprising (1) a first region of a second conductivity type, the second conductivity type being opposite the first conductivity type, and (2) a second region of the second conductivity type adjacent the first region, the second region having a greater majority carrier concentration than the first region, and the second region being disposed above the first region; and (g) a plurality of source regions of the first conductivity type positioned adjacent the trenches within upper portions the trench body regions.

In some preferred embodiments, the trench MOSFET device is a silicon device having a specific on-resistance ranging from 0.13 to 0.22 ohm-cm$^2$ and a breakdown voltage ranging from 20 to 30 V.

In others, the termination body regions preferably range from 2.0 to 2.2 µm in minimum depth and the trench body regions preferably range from 1.6 to 1.8 µm in maximum depth. The trench body regions preferably range from 1.2 to 2.0 µm in maximum width and the trenches preferably range from 1.0 to 2.0 µm in maximum depth.

In some preferred embodiments, the device will further comprise a terminal masking feature, such as a terminal oxide feature, spaced at least 3.0 microns from an adjacent peripheral trench.

In other preferred embodiments, the first conductivity type is N-type conductivity, the second conductivity type is P-type conductivity, and the body regions are doped with boron. More preferably, the substrate is an N+ substrate, the epitaxial layer is an N epitaxial layer, the first region is a P− region, the second region is a P region, and the source regions are N+ regions.

Several preferred resistivity values for the trench MOSFET of the present invention are as follows:

- a substrate resistivity ranging from 0.005 to 0.01 ohm-cm,
- an epitaxial layer resistivity ranging from 0.18 to 0.25 ohm-cm,
- a first region resistivity ranging from 0.4 to 0.8 ohm-cm,
- a second region resistivity ranging from 0.15 to 0.4 ohm-cm, and
- source region resistivities ranging from 0.003 to 0.001 ohm-cm.

Such values are particularly preferred in connection with 20 to 30 V devices.

According to another aspect of the invention, a method of forming a trench MOSFET device is provided. The method comprises:

(a) providing a substrate of a first conductivity type;

(b) forming an epitaxial layer of the first conductivity type over the substrate, the epitaxial layer having a lower majority carrier concentration than the substrate;

(c) forming a plurality of trenches within the epitaxial layer, the trenches being lined by a first insulating layer and containing a conductive region adjacent to the first insulating layer;

(d) forming within an upper portion of the epitaxial layer one or more trench body regions and one or more termination body regions, the termination body regions extending into the epitaxial layer to a greater depth than the trench body regions; each trench body region and each termination body region comprising (a) a first region of a second conductivity type, the second conductivity type being opposite the first conductivity type, and (b) a second region of the second conductivity type adjacent the first region, the second region having a greater majority carrier concentration than the first region, and the second region being disposed above the first region; and (e) forming a plurality of source regions of the first conductivity type adjacent the trenches within upper portions the trench body regions.

The first insulating layer is preferably an oxide layer, and the step of forming the oxide layer preferably comprises dry oxidation.

The step of forming the trenches preferably includes the step of forming a patterned masking layer over the epitaxial layer and etching the trenches through the masking layer.

The step of providing a conductive region within the trenches preferably comprises depositing a layer of polycrystalline silicon and subsequently etching the polycrystalline silicon.

The step of forming the one or more trench body regions and the one or more termination body regions preferably comprises: (a) forming a terminal masking feature; (b) forming a layer of second conductivity type within an upper portion of the epitaxial layer; (c) forming the trenches in the epitaxial layer, the trenches extending through the layer of second conductivity type such that distinct first regions of second conductivity type are formed; (d) forming an oxide layer over at least portions of trench walls adjacent the first regions, the step of forming the oxide layer resulting in areas of reduced majority carrier concentration within the first regions adjacent the oxide layer; and (e) forming second regions of second conductivity type within the epitaxial layer adjacent to and above the first regions of second conductivity type. The trenches are preferably spaced sufficiently close such that, during the step of forming the oxide layer, the majority concentration is reduced throughout the first regions between the trenches. The terminal masking feature is preferably spaced sufficiently far from a nearest peripheral trench such that the step of forming the oxide layer has substantially no effect on bulk majority carrier concentration in the first regions between the peripheral trench and the masking feature.

Preferably, the maximum distance between the trenches ranges from 1.2 to 2.0 microns and the minimum distance between the peripheral trenches and the terminal oxide feature ranges from 3.0 to 4.0 microns.

The step of forming the layer of second conductivity type and the step of forming the second regions preferably includes implanting and diffusing a dopant into the epitaxial layer.

In one preferred instance, the step forming the oxide layer over at least portions of the trench walls adjacent the first regions comprises dry oxidation at a temperature ranging from 900 to 1100° C., more preferably 900 to 950° C. In another instance, this step comprises oxidation in steam at a temperature ranging from 900 to 1100° C., more preferably 900 to 950° C.

Preferably, the step of forming the source regions comprises forming a patterned masking layer and implanting and diffusing a dopant into upper portions of the trench body regions.

One advantage of the present invention is that a trench MOSFET device with increased cell density, and hence lower on-resistance, is provided without a substantial increase in device threshold voltage.

Other advantages of the present invention are that such a trench MOSFET device can be provided without a substantial increase in gate charge and without a substantial degradation in device breakdown voltage in the termination areas.

Yet another advantage of the present invention is that a trench MOSFET device is provided with increased cell density, decreased trench depth and decreased P-body junction depth, while avoiding a substantial degradation of device breakdown voltage in the termination areas. Moreover, breakdown in the termination areas is prevented without resorting to additional steps to deepen the P-type region in the termination area.

These and other embodiments and advantages of the present invention will become immediately apparent to those of ordinary skill in the art upon review of the Detailed Description and Claims to follow.

DETAILED DESCRIPTION OF THE INVENTION

The present invention now will be described more fully hereinafter with reference to the accompanying drawings, in which preferred embodiments of the present invention are shown. This invention may, however, be embodied in different forms and should not be construed as limited to the embodiments set forth herein. For example, this description is largely directed to an N-channel 20–30V device, but other devices are clearly possible.

Figure 2:
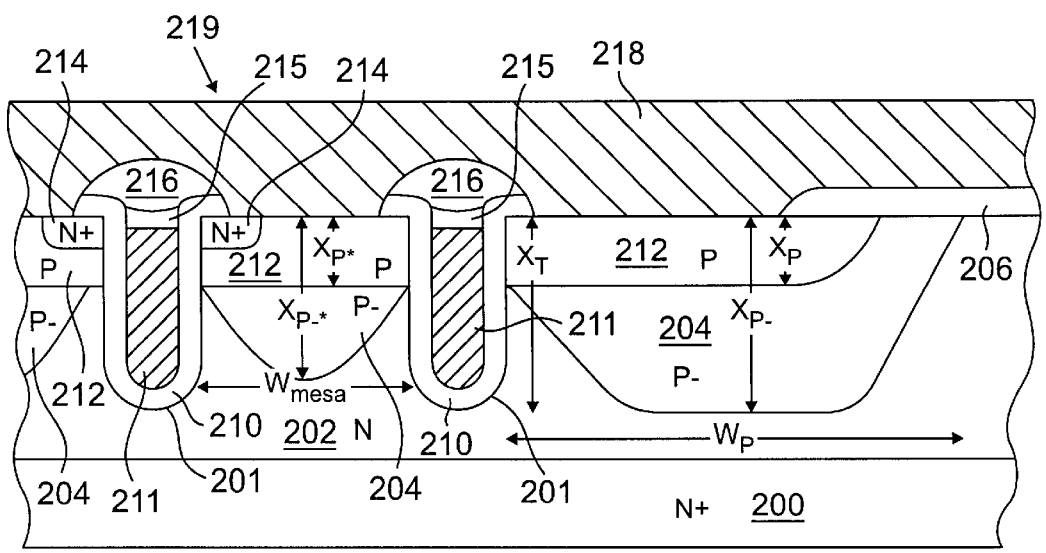
FIG. 2 is a sectional view of a trench MOSFET device according to an embodiment of the present invention.

Turning now to FIG. 2, a trench MOSFET 219 is shown wherein an N-type epitaxial layer 202 is provided on an N+ substrate 200. The N+ substrate 200 is typically a silicon substrate having a thickness ranging from 20 to 25 mils and a resistivity ranging from 0.005 to 0.01 Ohm-cm. The N-type epitaxial layer 202 is also typically silicon and has a thickness ranging from 5 to 6 μm and a resistivity ranging from 0.18 to 0.25 Ohm-cm.

Trenches 201 formed within the epitaxial layer are lined with gate oxide 210 and filled with polysilicon (i.e., polycrystalline silicon) gate electrodes 211. The gate oxide 210 is typically 500 to 700 Angstroms thick. The polysilicon electrodes 211 typically have a resistivity of 15 to 25 Ohm/sq. The trenches 201 typically have a depth $X_T$ of 1.0 to 2.0 microns. The regions between the trenches are frequently referred to as mesas or trench mesas, based on their shape. To achieve the specific on-resistance of 0.22 to 0.17 mOhm-cm$^2$ for a 30 V device, the cell density of the device of FIG. 2 is increased to the point where the trench spacing, as reflected by the mesa width $W_{mesa}$, typically ranges from 2.3 to 1.6 microns.

Within the epitaxial layer are P– regions 204 and P regions 212, which together form the P body regions of the device. P body regions in the trench area (i.e., between adjacent trenches) are referred to herein "trench P body regions", while P body regions in the termination area (i.e., adjacent to and outside of a trench on the periphery) are referred to as "termination P body regions". A "peripheral trench" refers to a trench, or a portion thereof, which is formed in a surface and is flanked on one side, but not the other, by one or more similar structures. In contrast, an "internal trench" refers to a trench, or a portion thereof, which is formed in a surface and is flanked on both sides by one or more similar structures.

The resistivity of the P regions 212 typically ranges from 0.15 to 0.4 Ohm-cm, while the resistivity of the P– regions 204 typically ranges from 0.4 to 0.8 Ohm-cm. The P regions 212 typically extend into the epitaxial layer to a depth of 1.5 to 1.7 microns. This depth is designated by $X_P$ in the termination area (right-hand side of the figure) and by $X_{P*}$ in the trench area. These depths are preferably essentially the same, as can be seen in FIG. 2.

The P– regions 204 (and hence the P-body regions) in the termination area extend to a depth $X_{P-}$, while the P– regions 204 in the trench area extend to a depth $X_{P-*}$. As seen from FIG. 2, junction depth $X_{P-}$ is greater than junction depth $X_{P-*}$. Typically, $X_{P-}$ ranges from 2.0 to 2.2 microns, while $X_{P-*}$ ranges from 1.6 to 1.8 microns for a device structure in which the trench depth equals 2.0 μm.

The relatively shallow trench depth $X_T$ and the relatively shallow junction depth in the trench region $X_{P-*}$ act together to offset the increase in gate charge that would ordinarily occur in connection with the high cell density of the device of FIG. 2. At the same time, if the junction depth $X_{P-}$ in the termination area were to be reduced to the same degree as the junction depth $X_{P-}*$ in the trench area, then breakdown in the termination area could become problematic. However, in the present invention, the relatively deep junction depth in the terminal region $X_{P-}$ discourages device breakdown in that region.

As will be appreciated more fully below, due to the placement of a terminal masking feature, such as terminal oxide feature 206, relative to the adjacent peripheral trench 201, the widths of the P-body regions (which includes the P– regions 204 as well as the P regions 212) in the terminal area $W_P$ are substantially greater than the widths of the P-body regions in the trench regions $W_{mesa}$. As will be more fully appreciated after reviewing the process discussion below, where the width $W_{mesa}$ is sufficiently narrow, substantial redistribution of the dopant in the trench area P– regions 204 occurs during processing, leading to a relatively shallow junction depth $X_{P-*}$ in the trench region. On the other hand, where $W_P$ is substantially greater than $W_{mesa}$, significantly less dopant redistribution will occur in the P– regions 204 of the termination area, leading to a junction depth $X_{P-}$ in the termination region that is substantially greater than $X_{P-*}$. In this way, the present inventors are able to independently control the junction depths $X_{P-}*$ and $X_{P-}$ to a certain extent.

The device of FIG. 2 also contains N+ source regions 214, which typically extend to a depth of 0.3 to 0.45 microns and have a resistivity of 0.001 to 0.003 ohm-cm. Electrical contact is made with N+ source regions 214 via metal contact layer 218. In the same step, a separate metal contact (not shown) is also connected to the gate runner, which is located outside the cells. Oxide layers 215 and BPSG (borophosphosilicate glass) regions 216 prevent the polysilicon gate electrodes 211 from being shorted to the N+ source regions 214. A metal drain contact (not shown) is also typically provided in connection with the N+ substrate 200.

Figure 3A:
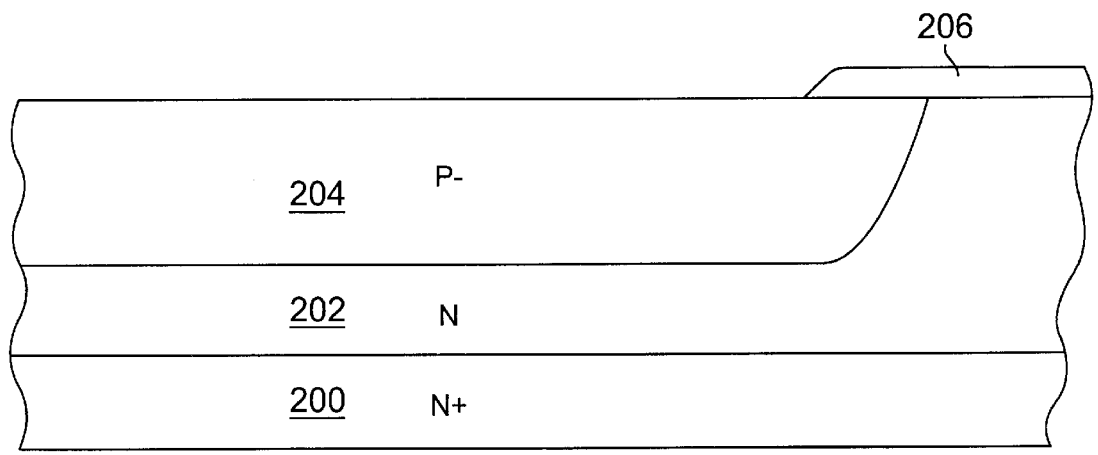
FIGS. 3A–3E are sectional views illustrating a method of manufacturing a trench DMOS according to an embodiment of the invention.

A process for making the trench MOSFET device of FIG. 2 will now be described. Referring to FIGS. 3A–3E, an N doped epitaxial layer 202 is initially grown on an N+ doped substrate 200. For example, epitaxial layer 202 can be 5 to 6 microns thick and have an n-type doping concentration of 3.0e16 to 3.5e16 cm$^{-3}$ for a 30 V trench DMOS device. Next, an initial oxide layer is grown over the epitaxial layer surface, for example, to a thickness of 5000 to 10000 Angstroms by oxidation at 1000 to 1150° C. in a steam oxygen atmosphere. A patterned masking layer (not shown) is then applied to the initial oxide layer, and the oxide is removed where not protected by the mask, for example by RIE etching, to create terminal oxide feature 206. P– region 204 is then formed in the epitaxial layer 202 by implantation and diffusion. For example the epitaxial layer 202 may be implanted with boron at 40 to 60 keV with a dosage of 1e13 cm–3, followed by diffusion at 1150° C. The depth of the P– layer at this point is about 1.8 to 2.0 microns. The resulting structure is shown in FIG. 3A.

A mask oxide layer is then deposited, for example by chemical vapor deposition, to a thickness of 5000 to 10000 Angstroms. A patterned trench mask (not shown) is then applied, followed by oxide etching through apertures in the trench mask, typically by RIE. The trench mask is removed and trenches 201 are etched through apertures in the oxide layer, typically by reactive ion etching. Trench depths preferably range from about 1.0 to 2.0 μm. Discrete oxide regions 208 and P– regions 204 are established as a result of this trench-forming step. The resulting structure is shown in FIG. 3B.

A sacrificial oxide is then grown, typically by dry oxidation at about 1000 to 1150° C. for about 50 to 65 minutes, to provide a continuous oxide layer 209 (as shown in FIG.

Figure 3B:
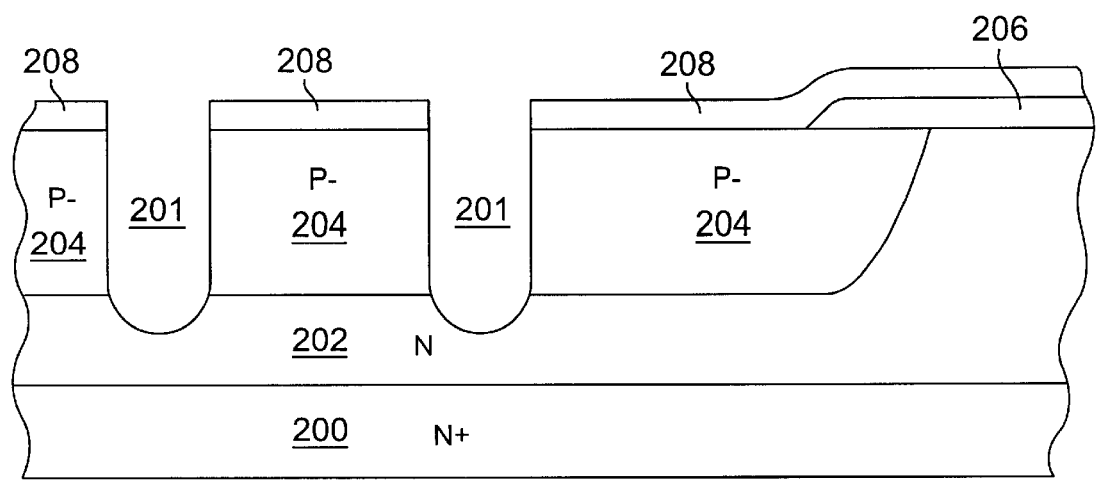

3C, this layer comprises both the newly formed sacrificial oxide in the trenches as well as the oxide regions 208 seen in FIG. 3B).

Formation of the sacrificial oxide in the trenches results in a redistribution of P-body dopant, in this instance boron, between the P– region 204 and the sacrificial oxide.

It is known that dopants such a boron atoms redistribute during oxidation process steps. Without wishing to be held to theory, it is has been observed that this redistribution is due to three concurrent effects:

(1) the dopant segregation coefficient m, where $$M = \frac{C_{Si}}{C_{Ox}},$$

(2) the ratio of the diffusion coefficients of the dopant in silicon and in oxide or $$\frac{D_{dopant,Si}}{D_{dopant,Ox}}$$

and (3) ratio of the parabolic oxidation rate constant B and the root of the diffusion coefficient of the dopant in silicon or $$\frac{B}{\sqrt{D_{dopant,Si}}}.$$

Figure 4:
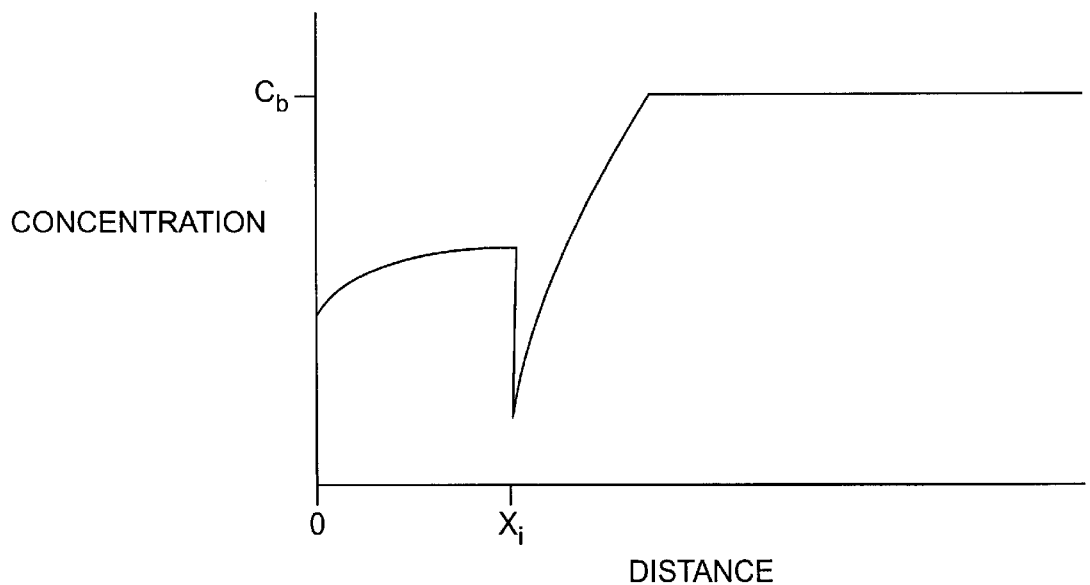
FIG. 4 illustrates approximate doping profiles in a boron-doped silicon material after formation of a surface oxide in dry oxygen at 900° C.

FIG. 4 illustrates approximate doping profiles in a boron-doped silicon material after formation of a surface oxide in dry oxygen at 900° C. In FIG. 4, the oxide region corresponds to the left-hand side of the plot between x=0 (the oxide surface) and $x_i$ (the oxide/silicon interface). The silicon region corresponds to the right-hand side of FIG. 4 in the region beyond $x_i$. Prior to oxidation, the silicon was uniformly doped at a bulk concentration $C_b$. After oxidation the bulk silicon region at the right-hand side of FIG. 4 remains at this level. However, as the interface is approached, the dopant concentration in the silicon decreases. In this case, the concentration of boron at the silicon interface is about 20% of the concentration of boron in the bulk, $C_b$. (By way of comparison, the concentration of the boron in the oxide layer at the interface is about 60% of $C_b$.)

The table to follow illustrates $C_i/C_b$ (ratio of boron concentration in silicon at the interface $C_i$ to boron concentration in the silicon bulk $C_b$) after oxidation of a silicon layer with initial concentration $C_b$. As noted above in connection with FIG. 4, this ratio is about 0.2 (20%) where silicon is oxidized in dry oxygen at 900° C. This ratio and several others are presented in the following table. Note from this table that a greater redistribution occurs at the interface at lower temperatures and for steam oxidation.

| Temperature (° C.) | $C_i/C_b$ after Dry Oxidation | $C_i/C_b$ after Steam Oxidation at 640 torr |
| --- | --- | --- |
| 900 | 0.2 | 0.14 |
| 1000 | 0.25 | 0.16 |
| 1100 | 0.39 | 0.20 |
| 1200 | 0.56 | 0.29 |

Additional information on this topic can be found in, e.g., *Semiconductor Technology Handbook,* pages 4.1 et seq. Technology Associates (1985), the disclosure of which is herein incorporated by reference.

In addition to oxide formation conditions (for example, as seen from the above, both oxide growth temperature and oxide growth conditions affect boron concentration profile), the extent of boron redistribution is further influenced by the trench spacing (i.e., the trench mesa dimensions). In general, the narrower is the trench mesa, the greater is the dopant segregation, because there is less boron within the mesa area. Stated another way, it is noted that the greatest dopant redistribution effects occur at the sacrificial oxide surface. If the width of the mesa formed between trenches is sufficiently narrow, these surface effects will extend to the center of the mesa, and narrower mesas will have lower peak P-type doping concentrations.

Figure 3C:
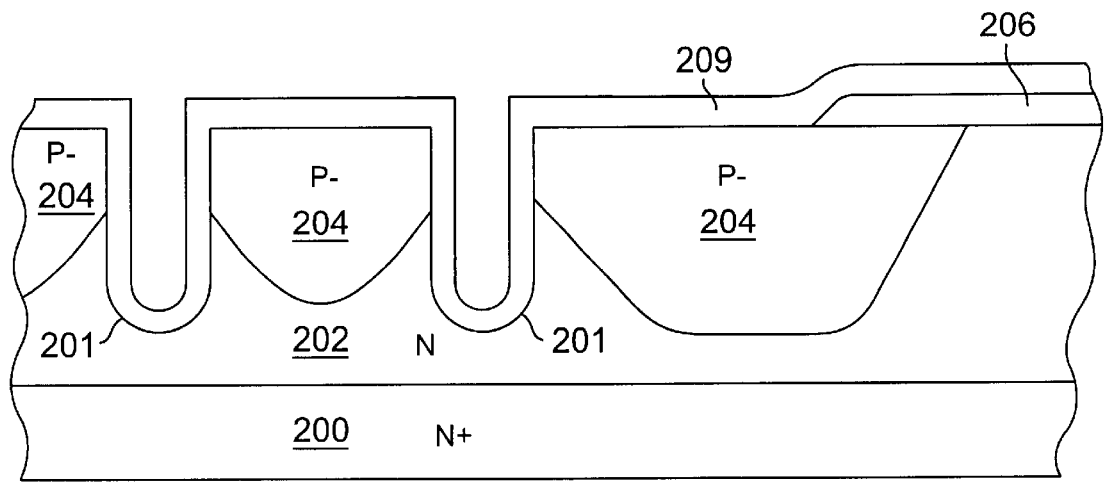

As a result of redistribution effects, after forming the sacrificial oxide layer, the concentration of boron in the P– region 204 is depleted in the vicinity of the sacrificial oxide layer. Accordingly, the junctions between the N epitaxial region 202 and the P– region 204 bend upward at the walls of the trenches 201 as shown in FIG. 3C. It can also be seen in FIG. 3C that the dopant redistribution results in P– regions 204 between trenches 201 that are shallower than the P– region 204 in the termination area. This difference in depth is established in a single oxidation step, without the need for additional masking and diffusion steps.

Figure 3D:
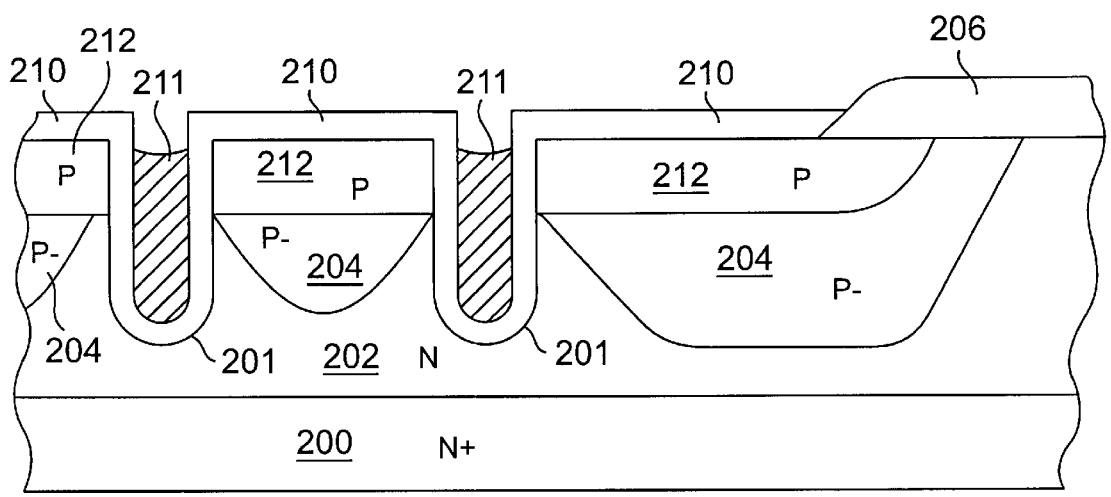

The oxide layer 209 is then removed and an oxide layer 210 is grown in its place, typically by dry oxidation at 950 to 1050° C. Oxide layer 210 acts as the gate oxide for the finished device. A thickness in the range of 500 to 700 Angstroms is typical for oxide layer 210. The surface of the structure is then covered, and the trenches are filled, with a polysilicon layer, typically using CVD. The polysilicon is typically doped N-type to reduce its resistivity, generally on order of 20 Ω/sq. N-type doping can be carried out, for example, during CVD with phosphorous chloride or by implantation with arsenic or phosphorous. The polysilicon layer is then etched, for example, by reactive ion etching, to optimize its thickness within the trenches. Due to etching uniformity concerns, the polysilicon layer is slightly over-etched, and the thus-formed polysilicon gate regions 211 typically have top surfaces that are 0.1 to 0.2 microns below the adjacent surface of the epitaxial layer. P regions 212 are then formed in the upper portions of P– regions 204. For example the P regions 212 may be implanted with boron at 30 to 40 keV with a dosage of 3e13 to 4e13 cm−3, followed by diffusion at 1150° C. to a depth of about 1.5 to 1.7 microns. The P regions 212 are primarily created to provide the desired device threshold voltage. The resulting structure is shown in FIG. 3D.

Figure 1:
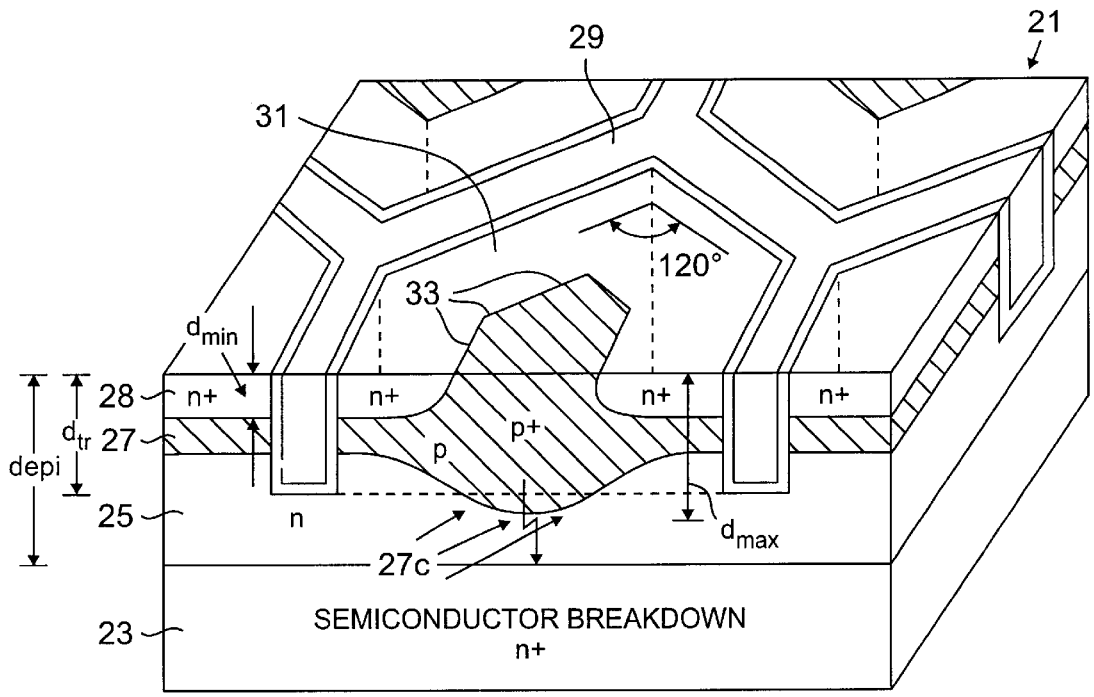
FIG. 1 is a schematic cross-sectional view of a trench DMOS power transistor cell in the prior art.

As noted above, with a prior art device such as that shown in FIG. 1, as the dimensions of the mesa region are reduced to increase cell density, the P+ region eventually diffuses laterally into the channel region, significantly increasing the threshold voltage of the device. In contrast, because a deep P+ region is avoided, the process of the present invention does not encounter such difficulties.

Figure 3E:
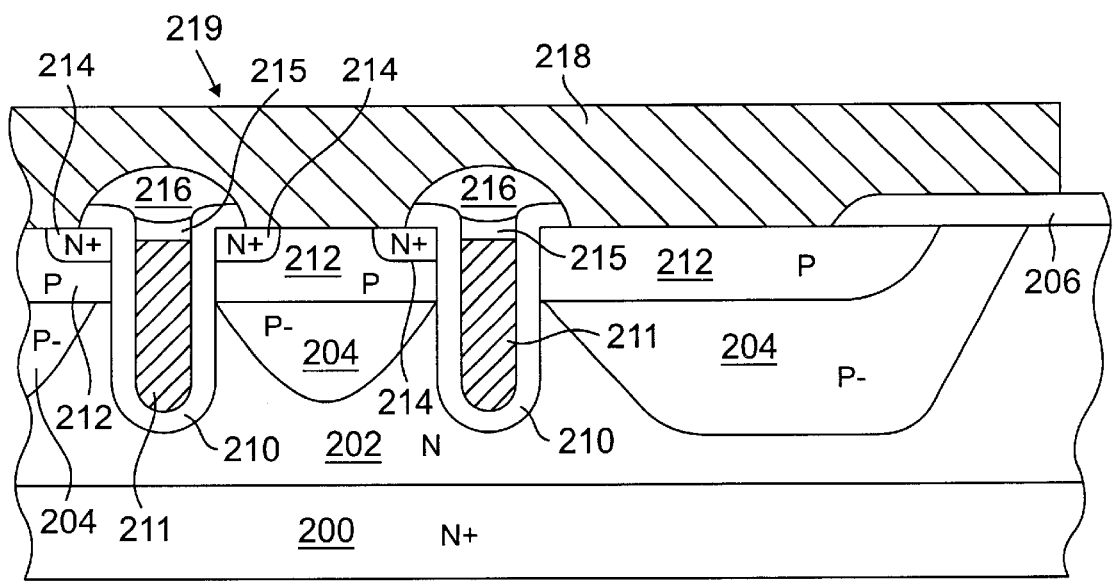

The device is then completed in a conventional fashion. For example, a patterned masking layer can be provided which defines N+ source regions 214. N+ source regions 214 can be formed within upper portions of the P regions 212 by an implantation and diffusion process. For example, the N+ source regions 214 may be implanted with As at 150 to 180 keV at a dosage of 5e15 to 1e16 cm−3. The source dopant is then diffused to a depth of 0.3 to 0.45 microns at a temperature of 900 to 950° C., increasing the thickness of exposed portions of oxide layers 210 and forming an oxide layer 215 on the polysilicon gate regions 211. A BPSG (borophosphosilicate glass) layer can then be formed over the entire structure, for example, by PECVD, and provided with a patterned photoresist layer. The structure can be etched, typically by reactive ion etching, removing the BPSG and oxide layers over at least a portion of each source region 214, while leaving behind BPSG regions 216 and oxide layer 215 over the polysilicon gate regions 211 (thus ensuring that the gate regions are insulated). The photoresist layer can then be removed and the structure provided with metal contact layer 218, which contacts the source regions 214 and acts as a source electrode. In the same step, a separate metal contact (not shown) is connected to the gate runner, which is located outside the cells. Another metal contact (not shown) is also typically provided in connection with substrate 200, which acts as a drain electrode. The resulting trench MOSFET 219 device is shown in FIG. 3E.

As an aside, prior art devices related to those of the present invention are frequently referred to as a trench DMOS (Double diffused MOS) transistor devices, due to the fact that two diffusion steps are used in their formation—one to form the P-body regions and one to form the sources. In contrast the devices of the present invention can be thought of a trench TMOS (triple diffused MOS) transistor devices, because three diffusion steps are used in its formation—one to form the P− regions 204, one to form the P regions 212 and one to form the N+ sources regions 214. Alternatively, the devices of the present invention can also be thought of as trench MOSFETs with double-diffused bodies, because the P-body regions are formed in two steps.

Although various embodiments are specifically illustrated and described herein, it will be appreciated that modifications and variations of the present invention are covered by the above teachings and are within the purview of the appended claims without departing from the spirit and intended scope of the invention. For example, the method of the present invention may be used to form a structure in which the conductivities of the various semiconductor regions are reversed from those described herein.

What is claimed is:

1. A trench MOSFET device comprising:

a substrate of a first conductivity type;

an epitaxial layer of said first conductivity type over said substrate, said epitaxial layer having a lower majority carrier concentration than said substrate;

a plurality of trenches within said epitaxial layer;

a first insulating layer lining said trenches;

a conductive region within said trenches adjacent to the first insulating layer;

one or more trench body regions and one or more termination body regions provided within an upper portion of said epitaxial layer, said termination body regions extending into said epitaxial layer to a greater depth than said trench body regions;

each trench body region and each termination body region comprising (a) a first region of a second conductivity type, said second conductivity type being opposite said first conductivity type, and (b) a second region of said second conductivity type adjacent said first region, said second region having a greater majority carrier concentration than said first region, and said second region being disposed above said first region and adjacent and extending to an outer wall of one of said plurality of trenches; wherein a bottom surface of said first region of said each trench body region is non-planar and located above a bottom surface of said trenches, and a plurality of source regions of said first conductivity type positioned adjacent said trenches within upper portions said trench body regions.

2. The trench MOSFET device of claim 1, wherein said trench MOSFET device is a silicon device.

3. The trench MOSFET device of claim 2, wherein the device has a specific on-resistance ranging from 0.13 to 0.22 mohm-cm2, and a breakdown voltage ranging from 20to 30 V.

4. The trench MOSFET device of claim 2 wherein the termination body regions ranging from 2.0 to 2.2 µm in minimum depth and the trench body regions range from 1.6 to 1.8 µm in maximum depth.

5. The trench MOSFET device of claim 4, wherein the trench body regions range from 1.2 to 2.0 µm in maximum width and the trenches range from 1.0 to 2.0 µm in maximum depth.

6. The trench MOSFET device of claim 2 further comprising a terminal masking feature, wherein said terminal oxide feature is spaced at least 3.0 microns from an adjacent peripheral trench.

7. The trench MOSFET of claim 6, wherein said terminal masking feature is a terminal oxide feature.

8. The trench MOSFET device of claim 2, wherein said first insulating layer is an oxide layer.

9. The trench MOSFET device of claim 2, wherein the conductive region is a polycrystalline silicon region.

10. The trench MOSFET device of claim 2, wherein said first conductivity type is N-type conductivity and said second conductivity type is P-type conductivity.

11. The trench MOSFET device of claim 10, wherein said body regions are doped with boron.

12. The trench MOSFET device of claim 10, wherein said substrate is an N+ substrate, said epitaxial layer is an N epitaxial layer, said first region is a P− region, said second region is a P region, and said source regions are N+ regions.

13. The trench MOSFET device of claim 12, wherein said substrate has a resistivity ranging from 0.005 to 0.01 ohm-cm, said epitaxial layer has a resistivity ranging from 0.18 to 0.25 ohm-cm, said first region has a resistivity ranging from 0.4 to 0.8 ohm-cm, said second region has a resistivity ranging from 0.15 to 0.4 ohm-cm, and said source regions have a resistivities ranging from 0.003 to 0.001 ohm-cm.

* * * * *

UNITED STATES PATENT AND TRADEMARK OFFICE
CERTIFICATE OF CORRECTION

PATENT NO. : 6,472,678 B1
DATED : October 29, 2002
INVENTOR(S) : Hshieh et al.

It is certified that error appears in the above-identified patent and that said Letters Patent is hereby corrected as shown below:

<u>Title page,</u>
Item [57], ABSTRACT,
Line 24, change "portions the trench body regions." to -- portions of the trench body regions. --

<u>Column 2,</u>
Line 53, change "portions the trench body regions." to -- portions of the trench body regions. --

<u>Column 3,</u>
Line 48, change "portions the trench body regions." to -- portions of the trench body regions. --

<u>Column 4,</u>
Line 26, change "1100° C.," to -- 1100° C,--
Line 28, change "1100° C.," to -- 1100° C,--

<u>Column 5,</u>
Line 67, change "Xp_*" to -- $X_{P_*}$ .--

<u>Column 6,</u>
Line 21, change "Xp_*" to -- $xp_*$ .--
Line 42, change "1150° C." to -- 1150° C --
Line 66, change "1150° C," to -- 1150° C --
Line 50, change "cm-3" to -- $cm^{-3}$ --

UNITED STATES PATENT AND TRADEMARK OFFICE
CERTIFICATE OF CORRECTION

PATENT NO. : 6,472,678 B1
DATED : October 29, 2002
INVENTOR(S) : Hshieh et al.

It is certified that error appears in the above-identified patent and that said Letters Patent is hereby corrected as shown below:

Column 7,
Line 11, change "it is has been" to -- it has been --

Column 8,
Line 54, change "cm-3" to -- $cm^{-3}$ --

Column 9,
Line 5, change "cm-3" to -- $cm^{-3}$ --
Line 7, change "950° C." to -- 950° C --
Line 35, change "sources" to -- source --

Column 10,
Line 14, change "within upper portions" to -- within upper portions of --
Line 21, change "20to 30" to -- 20 to 30 --
Line 21, change "cm2" to -- $cm^2$ --
Line 60, change "regions have a resistivities" to -- regions have resistivities --

Signed and Sealed this

Twenty-ninth Day of June, 2004

JON W. DUDAS
*Acting Director of the United States Patent and Trademark Office*